(12) United States Patent
Kim (10) Patent No.: US 7,558,146 B2
(45) Date of Patent: Jul. 7, 2009

(54) INTERNAL ADDRESS GENERATOR FOR USE IN SEMICONDUCTOR MEMORY DEVICE

(75) Inventor: Jee-Yul Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 325 days.

(21) Appl. No.: 11/529,285

(22) Filed: Sep. 29, 2006

(65) Prior Publication Data

US 2007/0070798 A1    Mar. 29, 2007

(30) Foreign Application Priority Data

Sep. 29, 2005   (KR) ...................... 10-2005-0091550
May 31, 2006   (KR) ...................... 10-2006-0049112

(51) Int. Cl.
    *G11C 8/00*    (2006.01)
(52) U.S. Cl. ............................. 365/230.06; 365/230.08; 365/230.1
(58) Field of Classification Search ............ 365/230.06, 365/230.08, 230.1, 230.13, 240
    See application file for complete search history.

(56) References Cited

U.S. PATENT DOCUMENTS

| 5,463,635 | A |  | 10/1995 | Kumazawa et al. |  |
|---|---|---|---|---|---|
| 5,787,045 | A |  | 7/1998 | Lee |  |
| 6,134,180 | A | * | 10/2000 | Kim et al. | 365/233.16 |
| 6,542,433 | B2 | * | 4/2003 | Ka | 365/230.06 |
| 7,227,811 | B2 | * | 6/2007 | Cho | 365/233.5 |
| 7,379,376 | B2 | * | 5/2008 | Oh et al. | 365/230.06 |
| 2003/0126413 | A1 |  | 7/2003 | El-Kik et al. |  |
| 2005/0152210 | A1 | * | 7/2005 | Park et al. | 365/233 |
| 2005/0166097 | A1 |  | 7/2005 | An |  |

FOREIGN PATENT DOCUMENTS

| JP | 7-141889 | 6/1995 |
|---|---|---|
| JP | 2000-057777 | 2/2000 |
| JP | 2003-085970 | 3/2003 |
| KR | 1998-084415 | 9/1998 |
| KR | 2001-020891 | 3/2001 |

* cited by examiner

*Primary Examiner*—Anh Phung
*Assistant Examiner*—Toan Le
(74) *Attorney, Agent, or Firm*—Mannava & Kang, P.C.

(57) ABSTRACT

An internal address generator for use in a semiconductor memory device includes an address detector, a drive pulse generator, and a delay unit. The address detector generates a comparison signal by comparing a first address currently input with a second address previously input. The drive pulse generator generates a drive pulse in response to the comparison signal. The delay unit outputs the first address as the second address and delays the second address to thereby generate an internal address synchronized with the drive pulse in case that the first address is different from the second address.

39 Claims, 7 Drawing Sheets

INTERNAL ADDRESS GENERATOR FOR USE IN SEMICONDUCTOR MEMORY DEVICE

FIELD OF THE INVENTION

The present invention relates to a semiconductor memory device, and more particularly to an internal address generator for use in semiconductor memory device for reducing current consumption.

BACKGROUND

Semiconductor memory devices typically receive an external column command such as an external read command or an external write command after an active command is input and operations in response to the active command are then completed. Hereinafter, delay between an input of the active command and an input of the external column command is referred to as tRCD. An address input with the external column command is input after tRCD. However, it is possible for a semiconductor memory device such as a DDR2 SDRAM to set input timing of the external column command even before tRCD. The semiconductor memory device holds the external column command input before tRCD for a predetermined time and generates an internal column command, such as an internal read command or an internal write command, corresponding to the external column command after tRCD passes from the timing of the active command. The predetermined time between an input of the external column command and generation of the internal column command is referred to as additive latency (AL). An external address input with the external column command is also held for the additive latency (AL) and, then, an internal address corresponding to the external address is generated.

Figure 1:
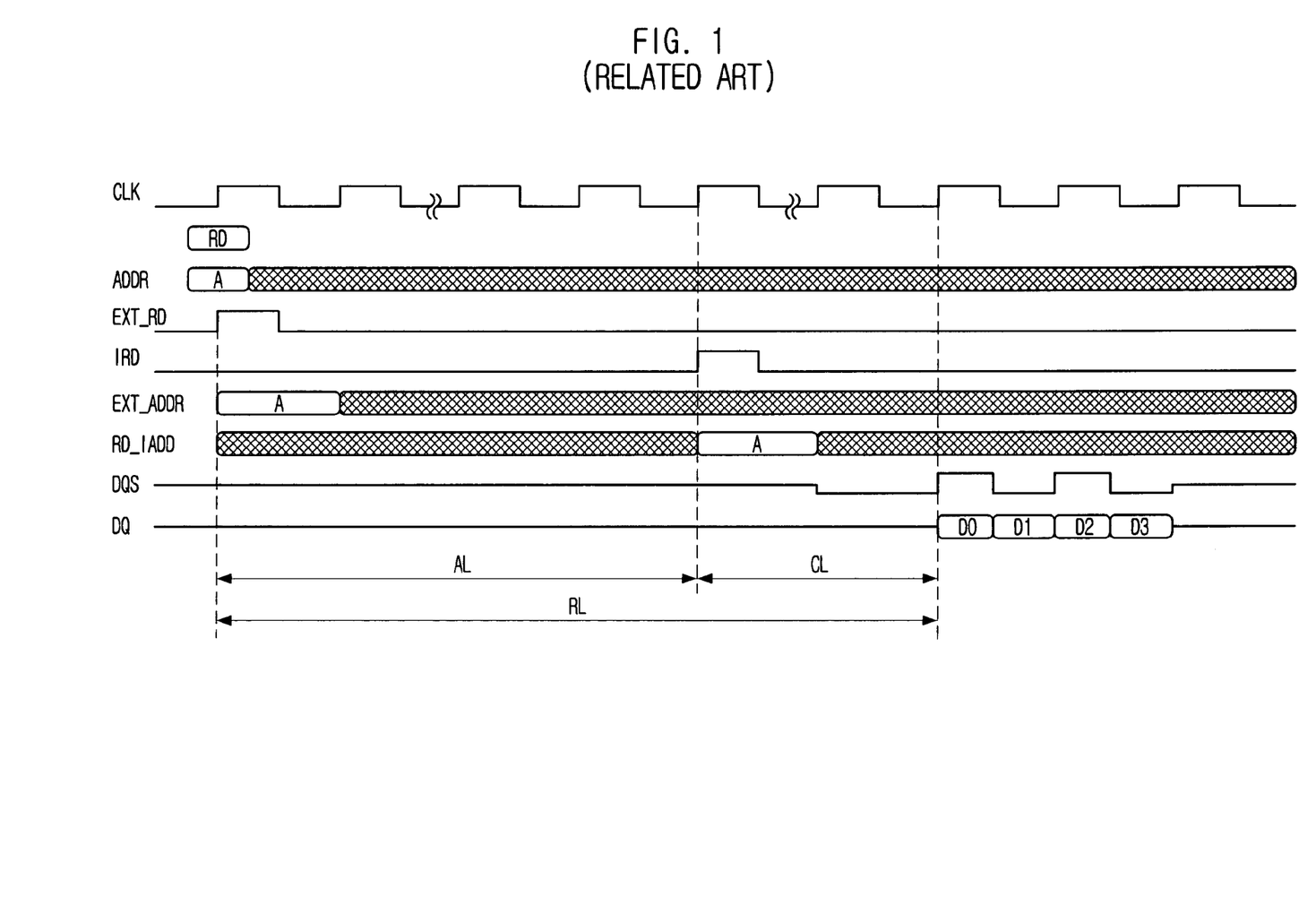
FIG. 1 is a timing diagram for a read operation of a semiconductor memory device.

FIG. 1 is a timing diagram for a read operation of a semiconductor memory device.

In order to perform a read operation, a semiconductor memory device such as DDR2 SDRAM generates an internal read address RD_IADD and an internal read command IRD after the additive latency AL passes from the input timing of an external read command RD and an external address EXT_ADDR. After a predetermined time from generation of the internal read command IRD and the internal read address RD_IADD, the semiconductor memory device starts to read a valid data D0 to D3. The predetermined time between the generation of the internal read command IRD and the internal address RD_IADD and start of the read operation is referred to as column address strobe (CAS) latency CL. The semiconductor memory device starts to perform the read operation after the additive latency AL and the CAS latency CL from the input timing of the read command and the address. A value obtained by adding the CAS latency CL to the additive latency AL is referred as a read latency RL.

Figure 2:
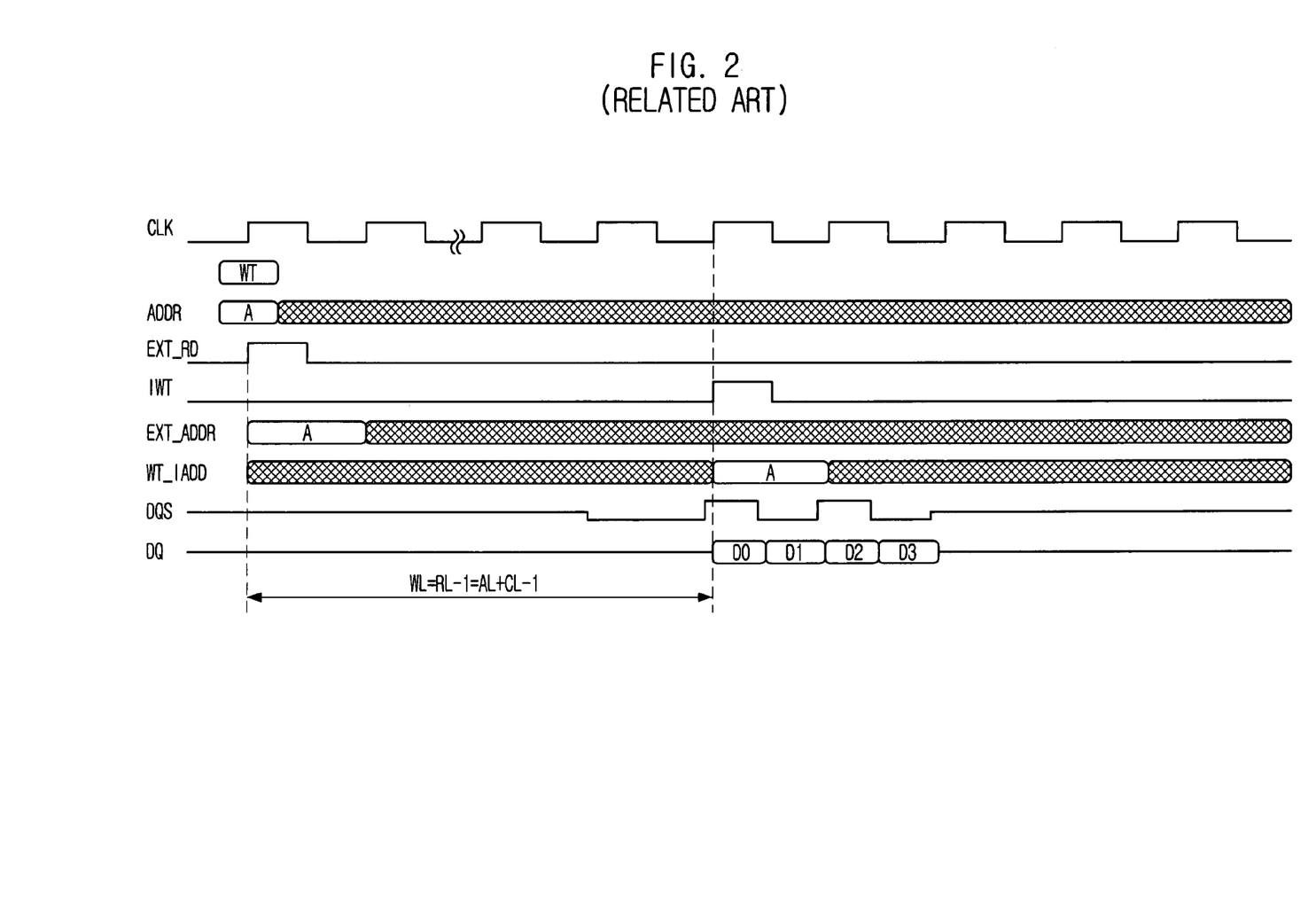
FIG. 2 is a timing diagram for a write operation of the semiconductor memory device.

FIG. 2 is a timing diagram for a write operation of the semiconductor memory device.

In the case of a write operation, the semiconductor memory device generates an internal write command IWT and an internal write address WT_IADD and performs the write operation after a write latency WL from an input timing of a write command WT and an external address EXT_ADDR. The write latency WL is less by one clock than the read latency RL. That is, WL=RL−1=(AL+CL)−1.

Figure 3:
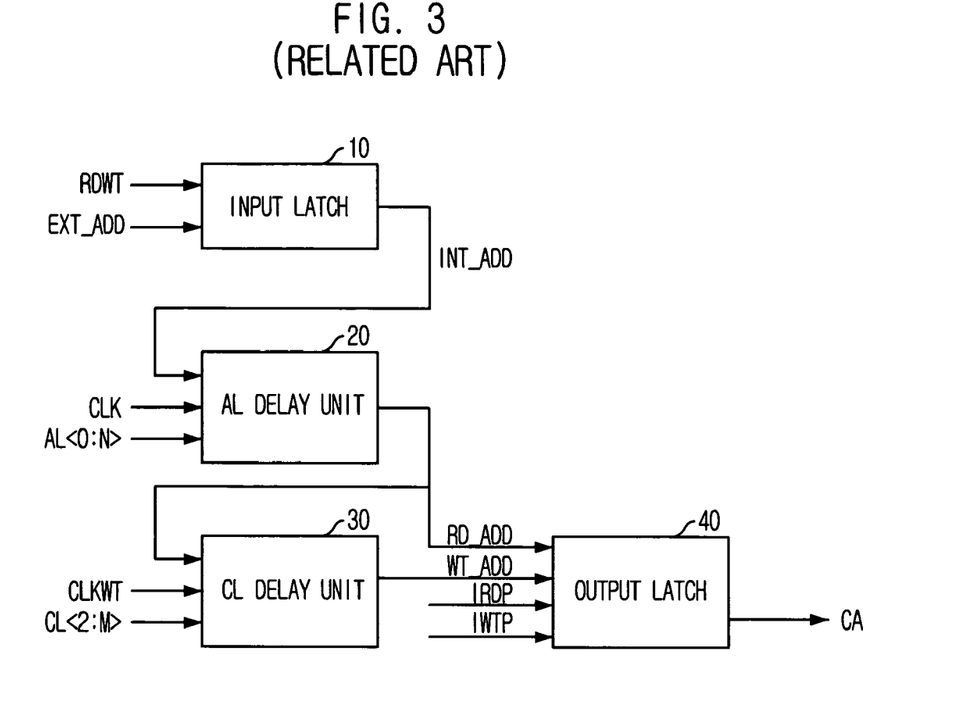
FIG. 3 is a block diagram of a conventional internal address generator for use in the semiconductor memory device.

FIG. 3 is a block diagram of a conventional internal address generator for use in a semiconductor memory device.

As shown, the internal address generator includes an input latch 10, an AL delay unit 20, a CL delay unit 30, and an output latch 40. The input latch 10 latches an external address EXT_ADD and outputs an internal address INT_ADD in response to a read/write signal RDWT. The read/write signal RDWT is activated when one of a read command RD and a write command WT is input. The AL delay unit 20 delays the internal address INT_ADD in response to an additive latency information signal AL<0:N> synchronized with a clock signal CLK to thereby output a read address RD_ADD. The CL delay unit 30 delays the read address RD_ADD in response to a CAS latency information signal CL<2:M> synchronized with a write clock CLKWT and outputs a write address WT_ADD. The write clock CLKWT is a clock signal activated when the write command WT is input. The output latch 40 selects one of the read address RD_ADD and the write address WT_ADD in response to a read drive signal IRDP and a write drive signal IWTP and outputs as a column address CA. The read drive signal IRDP is activated after the additive latency period added to input timing of the read command RD. The write drive signal IWTP is activated after the CAS latency period added to input timing of the write command WT. The additive latency information signal AL<0:N> and the CAS latency information signal CL<2:M> are multi-bit signals. Only the bit of the additive latency information signal AL<0:N> and the CAS latency information signal CL<2:M> corresponding to the additive latency AL and the CAS latency CL of the semiconductor memory device is activated.

Figure 4:
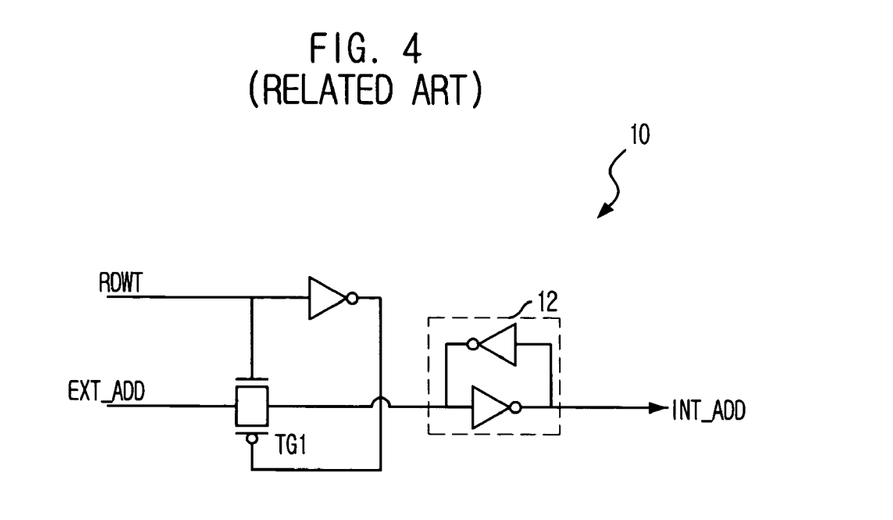
FIG. 4 is a schematic circuit diagram of an input latch shown in FIG. 3.

FIG. 4 is a schematic circuit diagram of the input latch 10 shown in FIG. 3.

As shown, the input latch 10 includes one transmission gate TG1 and a latch 12. The transmission gate TG1 transmits the external address EXT_ADD in response to the read/write signal RDWT. The latch 12 latches an output of the transmission gate TG1 and outputs the internal address INT_ADD. When one of the read command RD and the write command WT is input, the read/write signal RDWT is activated as a logic high level. The transmission gate TG1 transmits the external address EXT_ADD in response to the read/write signal RDWT of the logic high level. The latch 12 latches the external address EXT_ADD from the transmission gate TG1 and outputs as the internal address INT_ADD.

The AL delay unit 20 and the CL delay unit 30 include a plurality of shift registers.

Figure 5:
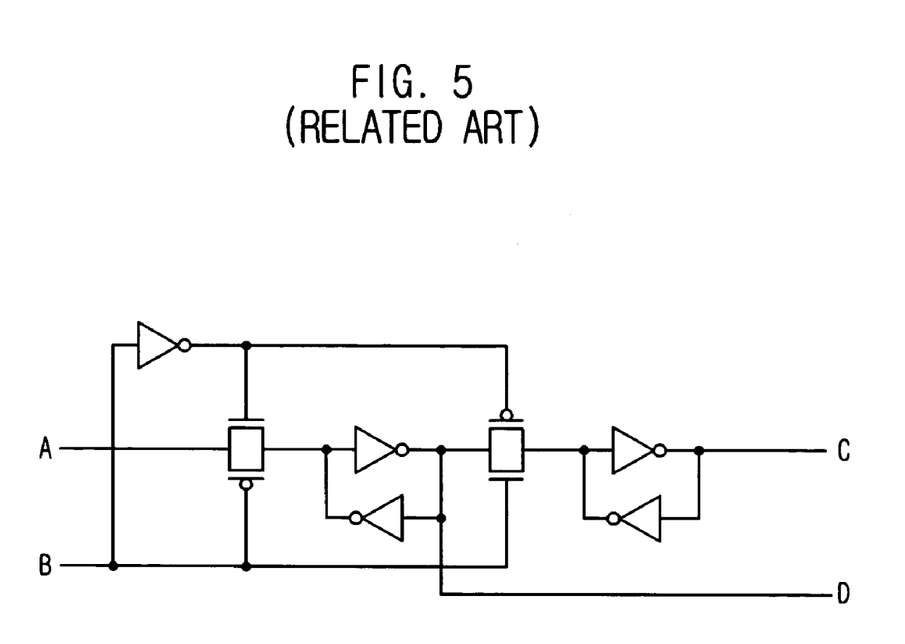
FIG. 5 is a schematic circuit diagram of a shift register included in an AL delay unit and a CL delay unit shown in FIG. 3.

FIG. 5 is a schematic circuit diagram of the shift register included in the AL delay unit 20 and the CL delay unit 30 shown in FIG. 3.

As shown, the shift register transmits data input through a terminal A in response to a drive clock signal input through a terminal B and outputs output signals through terminals C and D. For example, in case of the AL delay unit 20, the shift register transmits the internal address INT_ADD in response to the clock signal CLK. In case of the CL delay unit 30 transmits the read address RD_ADD in response to the write clock CLKWT. The shift register included in the AL delay unit 20 and the CL delay unit 30 shown in FIG. 3 performs its operation and, therefore, consumes power as long as the drive clock signal is input. However, there are some occasions that the shift register is not required to operate although the drive clock signal is input. For example, when an identical address is continuously input for several times, the shift register does not need to operate. Nevertheless, the shift register included the AL delay unit 20 and the CL delay unit 30 performs operation and, therefore, unnecessarily consumes power.

SUMMARY OF THE INVENTION

Embodiments of the present invention are directed to an internal address generator for use in a semiconductor memory device for reducing power consumption.

In accordance with an aspect of the present invention, there is provided an internal address generator for use in a semiconductor memory device that includes an address detector, a drive pulse generator, and a delay unit. The address detector generates a comparison signal by comparing a first address currently input with a second address previously input. The drive pulse generator generates a drive pulse in response to the comparison signal. The delay unit outputs the first address as the second address and delays the second address to thereby generate an internal address synchronized with the drive pulse in case that the first address is different from the second address.

In accordance with another aspect of the present invention, there is provided an internal address generator for use in a semiconductor memory device including an address detector, a drive pulse generator, an input latch, an additive latency (AL) delay unit, a CAS latency (CL) delay unit; and an output latch. The address detector generates a comparison signal by comparing a first address currently input and a second address previously input. The drive pulse generator generates a first to a fourth drive pulse in response to the comparison signal. The input latch latches the first address and outputs as the second address in response to the comparison signal and a read/write flag. The AL delay unit delays the second address for an additive latency synchronized with the first drive pulse. The CL delay unit delays an output of the AL delay unit for a CAS latency synchronized with the second drive pulse. The output latch selectively outputs the output of the AL delay unit or an output of the CL delay unit as an internal address in response to the third and the fourth drive pulses. The read/write flag is activated when at least one of a read command and a write command is input.

In accordance still another aspect of the present invention, there is provided method for driving an internal address generator for use in a semiconductor memory device. The method includes comparing an external address currently input with an intermediate address previously input and delaying the external address for a predetermined latency to thereby generate an internal address in case that the external address is different from the intermediate address.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, an internal address generator for use in a semiconductor memory device in accordance with the present invention will be described in detail referring to the accompanying drawings.

Figure 6:
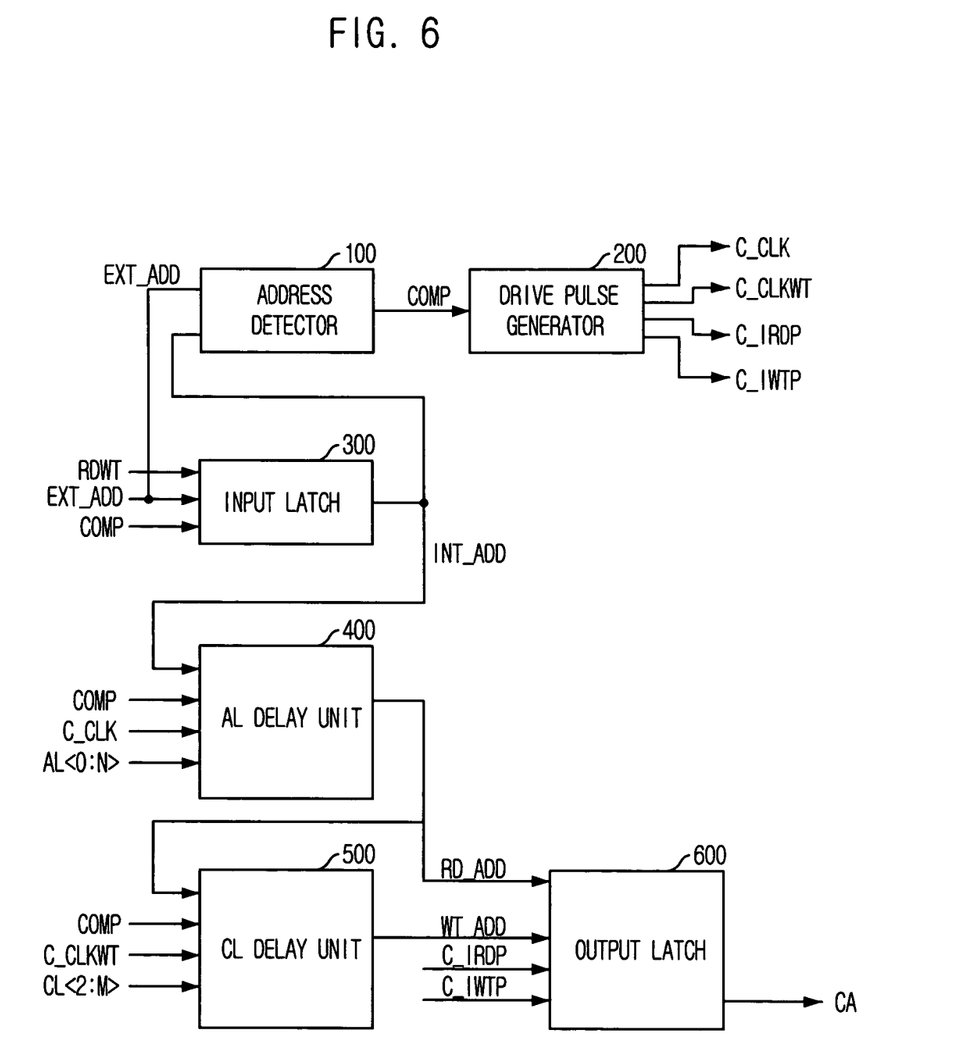
FIG. 6 is a block diagram of an internal address generator in accordance with an embodiment of the present invention.

FIG. 6 is a block diagram of an internal address generator in accordance with an embodiment of the present invention.

As shown, the internal address generator includes an address detector 100, a drive pulse generator 200, an input latch 300, an additive latency (AL) delay unit 400, a CAS latency (CL) delay unit 500, and an output latch 600.

The address detector 100 compares an external address EXT_ADD and an internal address INT_ADD and generates a comparison signal COMP. The drive pulse generator 200 generates a plurality of drive pluses C_CLK, C_CLKWT, C_IRDP, and C_IWTP in response to the comparison signal COMP. The input latch 300 latches the external address EXT_ADD in response to a read/write signal RDWT and the comparison signal COMP and output the internal address INT_ADD. The AL delay unit 400 delays the internal address INT_ADD in response to an additive latency information signal AL<0:N> synchronized with the first drive pulse C_CLK to thereby output a read address RD_ADD. The CL delay unit 500 delays the read address RD_ADD in response to a CAS latency information signal CL<2:M> synchronized with the second drive pulse C_CLKWT and outputs a write address WT_ADD. The output latch 600 selects one of the read address RD_ADD and the write address WT_ADD in response to the third drive pulse C_IRDP and the fourth drive pulse C_IWTP and outputs as a column address CA.

The internal address generator shown in FIG. 6 includes the address detector 100 for detecting whether an address currently input, i.e., the external address EXT_ADD, is identical with an address previously input, i.e., the internal address INT_ADD. The drive pulse generator 200 receiving an output of the address detector 100, i.e., the comparison signal COMP, provides the AL delay unit 400, the CL delay unit 500, and the output latch 600 with the drive pluses C_CLK, C_CLKWT, C_IRDP, and C_IWTP only when the external address EXT_ADD and the internal address INT_ADD are different. That is, the AL delay unit 400, the CL delay unit 500, and the output latch 600 are selectively enabled only when it is required and, therefore, the internal address generate is possible to reduce a power consumption.

Figure 7:
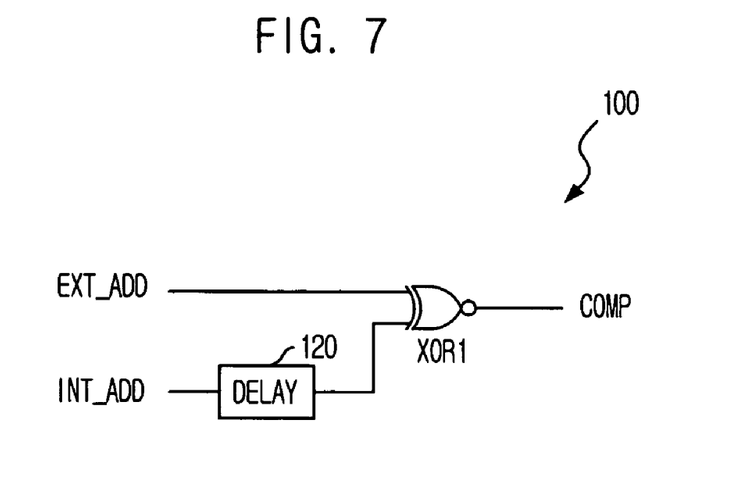
FIG. 7 is a schematic circuit diagram of an address detector shown in FIG. 6.

FIG. 7 is a schematic circuit diagram of the address detector 100 shown in FIG. 6.

As shown, the address detector 100 includes a delay 120 and an exclusive OR gate XOR1. The delay 120 delays the internal address INT_ADD for a predetermined time. The exclusive OR gate XOR1 logically combines an output of the delay 120 and the external address EXT_ADD to thereby output the comparison signal COMP. Accordingly, the address detector 100 outputs the comparison signal COMP of a logic low level when the external address EXT_ADD and the internal address INT_ADD are identical and, otherwise, activates the comparison signal COMP as a logic high level.

Figure 8:
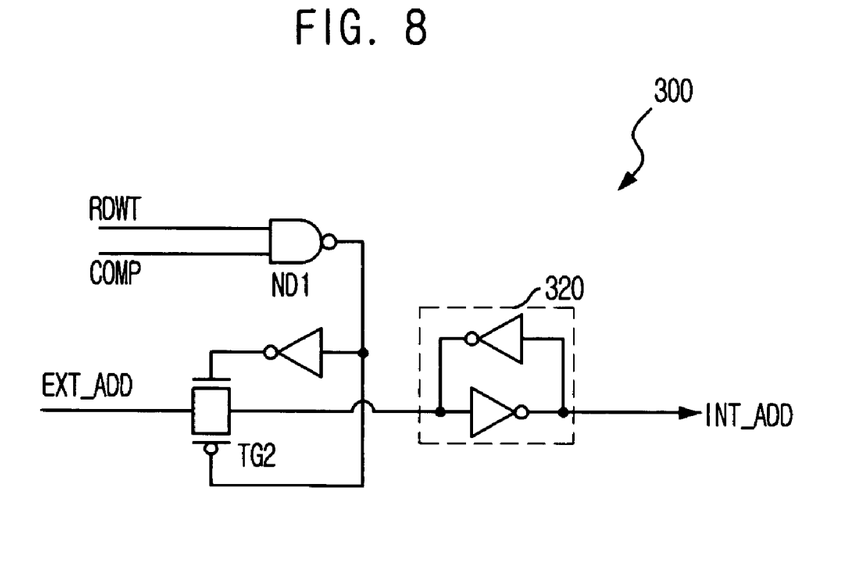
FIG. 8 is a schematic circuit diagram of an input latch shown in FIG. 6.

FIG. 8 is a schematic circuit diagram of the input latch 300 shown in FIG. 6.

As shown, the input latch 300 includes a first NAND gate ND1, a transmission gate TG2, and a latch 320. The first NAND gate ND1 logically combines the read/write signal RDWT and the comparison signal COMP and activates its output signal when both the read/write signal RDWT and the comparison signal COMP are activated. The transmission gate TG2 transmits the external address EXT_ADD in response to the output signal of the first NAND gate ND1. The latch 320 latches an output signal of the transmission gate TG2 and outputs as the internal address INT_ADD. Accordingly, the input latch 300 outputs the external address EXT_ADD as the internal address INT_ADD when both the read/write signal RDWT and the comparison signal COMP are activated.

Figure 9:
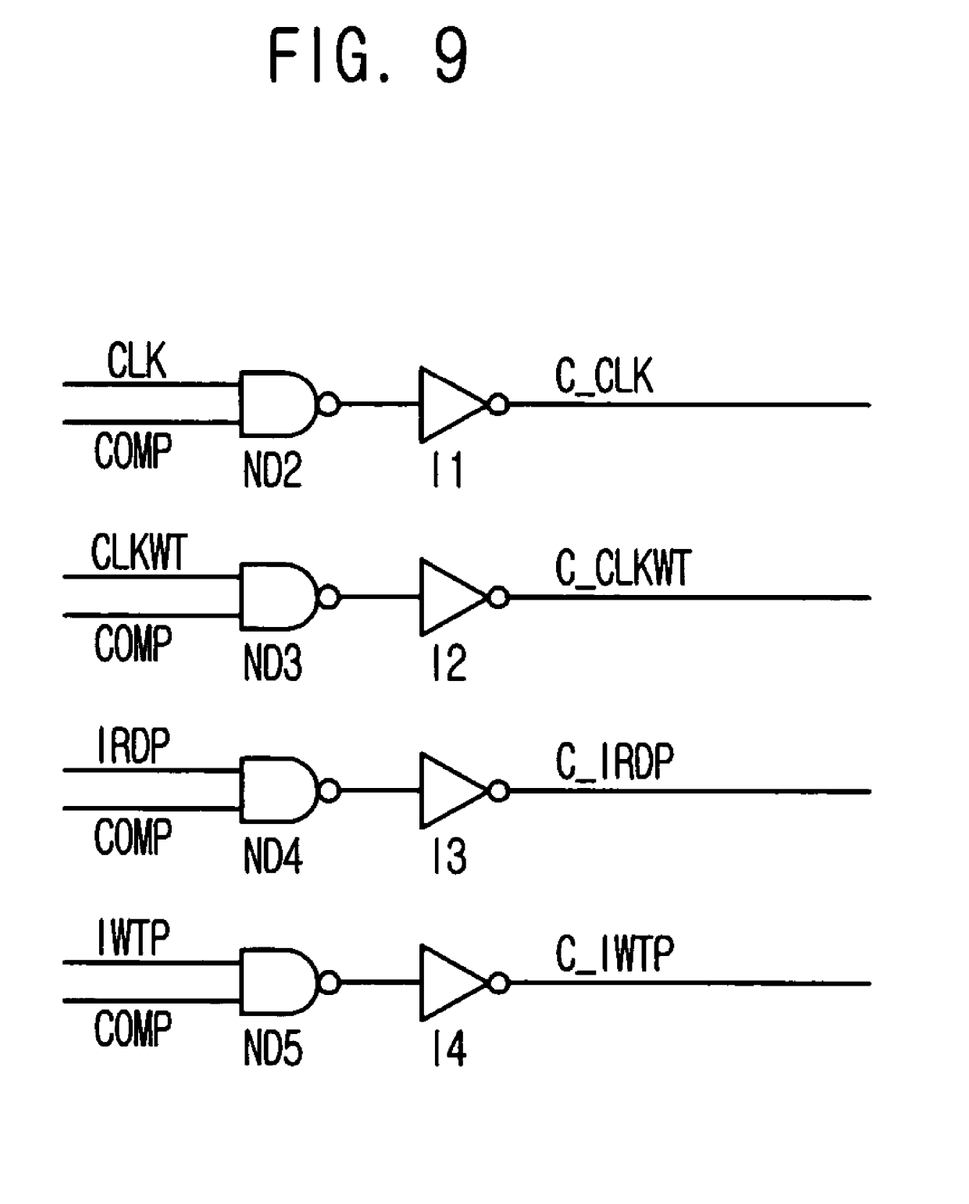
FIG. 9 is a schematic circuit diagram of a drive pulse generator shown in FIG. 6.

FIG. 9 is a schematic circuit diagram of the drive pulse generator 200 shown in FIG. 6.

As shown, the drive pulse generator 200 includes first to fourth drive pulse generation blocks. The first drive pulse generation block is provided with a second NAND gate ND2 and a first inverter I1. The second NAND gate ND2 logically combines the clock signal CLK and the comparison signal COMP. The first inverter I1 inverts an output of the second NAND gate ND2 and outputs as the first drive pulse C_CLK. The second drive pulse generation block includes a third NAND gate ND3 and a second inverter I2. The third NAND gate ND3 logically combines the write clock CLKWT and the comparison signal COMP. The second inverter I2 inverting an output of the third NAND gate ND3 outputs the second drive pulse C_CLKWT. The third drive pulse generation unit includes a fourth NAND gate ND4 and a third inverter I3. The fourth NAND gate ND4 logically combines the read drive signal IRDP and the comparison signal COMP. The third inverter I3 inverts an output of the fourth NAND gate ND4 and outputs the third drive pulse C_IRDP. The fourth drive pulse generation block is provided with a fifth NAND gate ND5 and a fourth inverter I4. The fifth NAND gate ND5 logically combines the write drive signal IWTP and the comparison signal COMP. The fourth inverter I4 inverts an output of the fifth NAND gate ND5 and outputs the fourth drive pulse C_IWTP.

When the read/write signal RDWT is activated by the write command WT, the write clock CLKWT and the write drive signal IWTP are activated. The drive pulse generator 200 outputs the first, the second, and the fourth drive pulses C_CLK, C_CLKWT, and C_IWTP. When the read/write signal RDWT is activated by the read command RD, the read drive signal IRDP is activated. In this case, the drive pulse generator 200 outputs the first and the third drive pulses C_CLK and C_IRDP. The clock signal CLK for driving the semiconductor memory device including the internal address generator keeps an active state without regard to the command input to the internal address generator. When the comparison signal COMP is inactive, the drive pulse generator outputs the drive pulses C_CLK, C_CLKWT, C_IRDP, and C_IWTP of the logic low level regardless to states of the clock signal CLK, the write clock CLKWT, the read drive signal IRDP, and the write drive signal IWTP.

Hereinafter, the operation of the internal address generator shown in FIG. 6 is explained.

When the read command RD is input to the semiconductor memory device and the external address EXT_ADD is different from the internal INT_ADD, the address detector 100 activates the comparison signal COMP. The drive pulse generator 200 outputs the first and the third drive pulses C_CLK and C_IRDP in response to the comparison signal COMP. The input latch 300 latches the external address EXT_ADD and outputs as the input address INT_ADD in response to activation of the read/write signal RDWT and the comparison signal COMP. The AL delay unit 400 delays the internal address INT_ADD in response, to the AL information signal AL<0:N> and outputs the read address RD_ADD. The output latch 600 outputs the read address RD_ADD as the column address CA in response to the read drive signal C_IRDP.

Next, when write command WT is input to the semiconductor memory device and the external address EXT_ADD is different from the internal INT_ADD, the address detector 100 activates the comparison signal COMP. The drive pulse generator 200 outputs the first, the second, and the fourth drive pulses C_CLK, C_CLKWT, and C_IWTP. The input latch 300 latches the external address EXT_ADD and outputs as the input address INT_ADD in response to activation of the read/write signal RDWT and the comparison signal COMP. The AL delay unit 400 delays the internal address INT_ADD in response to the AL information signal AL<0:N> and outputs the read address RD_ADD. The CL delay unit 500 delays the read address RD_ADD in response to the CAS delay information signal CL<2:M> and outputs the write address WT_ADD synchronized with the second drive pulse C_CLKWT. The output latch 600 outputs the write address WT_ADD as the column address CA in response to the fourth drive pulse C_IWTP.

Nest, in case that the external address EXT_ADD and the internal address INT_ADD are identical, the address detector 100 disables the comparison signal COMP. The drive pulse generator 200 outputs the drive pulses C_CLK, C_CLKWT, C_IRDP, and C_IWTP of the logic low level in response to the inactivation of the comparison signal COMP. The input latch 300 does not latch the external address EXT_ADD in response to the inactivation of the comparison signal COMP. The AL delay unit 400, the CL delay unit 500, and the output latch 600 are disabled in response to the inactivation of the drive pulses C_CLK, C_CLKWT, C_IRDP, and C_IWTP.

As described above, the internal address generator of the present invention disables the drive pulses C_CLK, C_CLKWT, C_IRDP, and C_IWTP in case that the external address EXT_ADD is identical to the internal address INT_ADD and, therefore, the AL delay unit 400, the CL delay unit 500, and the output latch 600 are not driven. Accordingly, the present invention saves the power consumption by preventing the AL delay unit 400, the CL delay unit 500, and the output latch 600 from unnecessarily operating. The internal address generator is aligned for each bit of the address. Therefore, the present invention is effective for use in a semiconductor memory device having the large bit numbers. Further, the present invention is possible to be used for generating internal addresses corresponding to a bank address or a row address as well as the column address.

The present application contains subject matter related to Korean patent application Nos. 2005-91550 and 2006-49112, filed in the Korean Patent Office on Sep. 29, 2005 and on May 30, 2006, the entire contents of which is incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal address generator for use in a semiconductor memory device, comprising:
    an address detector configured to generate a comparison signal by comparing a first address currently input with a second address previously input;
    a drive pulse generator configured to generate a drive pulse in response to the comparison signal; and
    a delay unit configured to output the first address as the second address and delaying the second address to thereby generate an internal address synchronized with the drive pulse in case that the first address is different from the second address.

2. The internal address generator as recited in claim 1, wherein the address detector includes:
    a delay for delaying the second address for a predetermined time; and
    an exclusive OR gate for logically combining the first address and an output of the delay to thereby output the comparison signal.

3. The internal address generator as recited in claim 2, wherein the drive pulse generator includes:
- a NAND gate for logically combining the comparison signal and an input pulse; and
- an inverter for inverting an output of the NAND gate to thereby generate the drive pulse.

4. An internal address generator for use in a semiconductor memory device, comprising:
- an address detector configured to generate a comparison signal by comparing a first address currently input and a second address previously input;
- a drive pulse generator configured to generate a first to a fourth drive pulse in response to the comparison signal;
- an input latch configured to latch the first address and output the latched address as the second address in response to the comparison signal and a read/write flag;
- an additive latency (AL) delay unit configured to delay the second address for an additive latency synchronized with the first drive pulse;
- a CAS latency (CL) delay unit configured to delay an output of the AL delay unit for a CAS latency synchronized with the second drive pulse; and
- an output latch configured to selectively output the output of the AL delay unit or an output of the CL delay unit as an internal address in response to the third and the fourth drive pulses.

5. The internal address generator as recited in claim 4, wherein the read/write flag is activated when any one of a read command and a write command is input.

6. The internal address generator as recited in claim 5, wherein the address detector includes:
- a delay for delaying the second address for a predetermined time; and
- an exclusive OR gate for logically combining the first address and an output of the delay to thereby output the comparison signal.

7. The internal address generator as recited in claim 6, wherein the drive pulse generator includes:
- a first drive pulse generation unit for outputting a clock signal as the first drive pulse when the comparison signal is enabled;
- a second drive pulse generation unit for outputting a write pulse, activated in response to the write command, as the second drive pulse when the comparison signal is enabled;
- a third drive pulse generation unit for outputting a read drive signal, enabled in response to the read command, as the third drive pulse when the comparison signal is enabled; and
- a fourth drive pulse generation unit for outputting a write drive signal, enabled in response to the input of the write command, as the fourth drive pulse when the comparison signal is enabled.

8. The internal address generator as recited in claim 7, wherein the input latch includes:
- a controller for outputting a control signal enabled when both the comparison signal and the read/write flag are activated;
- a transmission gate for transmitting the first address in response to the control signal; and
- a latch for latching an output of the transmission gate and outputting the second address.

9. The internal address generator as recited in claim 8, wherein the controller includes a NAND gate for logically combining the comparison signal and the read/write flag.

10. The internal address generator as recited in claim 7, wherein the first drive pulse generator includes:

- a first NAND gate for logically combining the clock signal and the comparison signal; and
- a first inverter for inverting an output of the first NAND gate to thereby output the first drive pulse.

11. The internal address generator as recited in claim 10, wherein the second drive pulse generator includes:
- a second NAND gate for logically combining the write pulse and the comparison signal; and
- a second inverter for inverting an output of the second NAND gate to thereby output the second drive pulse.

12. The internal address generator as recited in claim 11, wherein the third drive pulse generator includes:
- a third NAND gate for logically combining the read drive signal and the comparison signal; and
- a third inverter for inverting an output of the third NAND gate to thereby output the third drive pulse.

13. The internal address generator as recited in claim 12, wherein the fourth drive pulse generator includes:
- a fourth NAND gate for logically combining the write drive signal and the comparison signal; and
- a fourth inverter for inverting an output of the fourth NAND gate to thereby output the fourth drive pulse.

14. An internal address generator for use in a semiconductor memory device, comprising:
- an address detector configured to generate a comparison signal by comparing a first address currently input and a second address previously input;
- a drive pulse generator configured to generate a plurality of drive pulses in response to the comparison signal;
- an input latch configured to latch the first address and output the latched address as the second address in response to the comparison signal and a read/write flag;
- a read address generation unit configured to generate a read address by delaying the second address for an additive latency synchronized with a read drive pulse of the drive pulses; and
- a write address generation unit configured to generate a write address by delaying the read address for a CAS latency synchronized with a write drive pulse of the drive pulses.

15. The internal address generator as recited in claim 14, wherein the read/write flag is activated when any one of a read command and a write command is input.

16. The internal address generator as recited in claim 15, wherein the address detector includes:
- a delay for delaying the second address for a predetermined time; and
- an exclusive OR gate for logically combining the first address and an output of the delay to thereby output the comparison signal.

17. The internal address generator as recited in claim 16, wherein the input latch includes:
- a controller for outputting a control signal enabled when both the comparison signal and the read/write flag are enabled;
- a transmission gate for transmitting the first address in response to the control signal; and
- a latch for latching an output of the transmission gate and outputting the second address.

18. The internal address generator as recited in claim 17, wherein the controller includes a NAND gate for logically combining the comparison signal and the read/write flag.

19. The internal address generator as recited in claim 17, wherein the read address generation unit includes:
- a first delay unit for delaying the second address for the additive latency synchronized with a first read drive pulse; and a read output unit for outputting an output of the first delay unit as the internal address synchronized with a second read drive pulse,
wherein the first and the second read drive pulses are generated by the drive pulse generator.

20. The internal address generator as recited in claim 19, wherein the write address generation unit includes:
a second delay unit for delaying the second address for the additive latency synchronized with a first write drive pulse;
a third delay unit for delaying an output of the second delay unit for the CAS latency synchronized with a second write drive pulse; and
a write output unit for outputting an output of the third delay unit as the internal address synchronized with a third write drive signal,
wherein the first to the third drive pulses are generated by the drive pulse generator.

21. The internal address generator as recited in claim 20, wherein the first read drive pulse and the first write drive pulse are the same signal and the first and the second delay units are the same block shared by the read address generation unit and the write address generation unit.

22. The internal address generator as recited in claim 21, wherein the drive pulse generation unit includes:
a first drive pulse generation unit for outputting a clock signal as one of the first read drive pulse and the first write drive pulse when the comparison signal is enabled;
a second drive pulse generation unit for outputting a write pulse, activated in response to the write command, as the second write drive pulse when the comparison signal is enabled;
a third drive pulse generation unit for outputting a read drive signal, activated in response to the read command, as the second read drive pulse when the comparison signal is enabled; and
a fourth drive pulse generation unit for outputting a write drive signal, activated in response to the write command, as the third write drive pulse when the comparison signal is enabled.

23. The internal address generator as recited in claim 22, wherein the first drive pulse generator includes:
a first NAND gate for logically combining the clock signal and the comparison signal; and
a first inverter for inverting an output of the first NAND gate to thereby output the first drive pulse.

24. The internal address generator as recited in claim 23, wherein the second drive pulse generator includes:
a second NAND gate for logically combining the write pulse and the comparison signal; and
a second inverter for inverting an output of the second NAND gate to thereby output the second drive pulse.

25. The internal address generator as recited in claim 24, wherein the third drive pulse generator includes:
a third NAND gate for logically combining the read drive signal and the comparison signal; and
a third inverter for inverting an output of the third NAND gate to thereby output the third drive pulse.

26. The internal address generator as recited in claim 25, wherein the fourth drive pulse generator includes:
a fourth NAND gate for logically combining the write drive signal and the comparison signal; and
a fourth inverter for inverting an output of the fourth NAND gate to thereby output the fourth drive pulse.

27. A method for driving an internal address generator for use in a semiconductor memory device, comprising:
comparing an external address currently input with an intermediate address previously input; and
delaying the external address for a predetermined latency to thereby generate an internal address in case that the external address is different from the intermediate address.

28. The method as recited in claim 27, wherein the delaying the external address includes:
receiving the external address as the intermediate address; and
delaying the intermediate address for the predetermined latency including an additive latency or a CAS latency to thereby output the internal address.

29. The method as recited in claim 28, wherein the delaying the intermediate address is performed by delaying the intermediate address for the additive latency in case that the external address is input with a read command and is performed by delaying the intermediate address for the additive latency and the CAS latency in case that the external address is input with a write command.

30. A method for driving an internal address generator for use in a semiconductor memory device, comprising:
comparing Nth address with (N−1)th address;
activating the internal address generator to generate an internal address by delaying the Nth address for a predetermined latency in case that the Nth address is different from the (N−1)th address; and
deactivating the internal address generator in case that the Nth address is identical to the (N−1)th address,
wherein N is a positive integer.

31. An internal address generator for use in a semiconductor memory device, comprising:
an address detector configured to generate a comparison signal by comparing an external address with an internal address;
a drive pulse generator configured to generate a plurality of drive pulses in response to the comparison signal; and
a latch unit configured to output the internal address without latching the external address in response to the inactivation of the plurality of drive pulses if the external address is identical to the internal address.

32. The internal address generator as recited in claim 31, wherein the address detector includes:
a delay for delaying the internal address for a predetermined time; and
an exclusive OR gate for logically combining the external address and an output of the delay to thereby output the comparison signal.

33. The internal address generator as recited in claim 32, wherein the drive pulse generator includes:
a NAND gate for logically combining the comparison signal and an input pulse; and
an inverter for inverting an output of the NAND gate to thereby generate the plurality of drive pulses.

34. An internal address generator for use in a semiconductor memory device, comprising:
an address detector configured to generate a comparison signal by comparing an external address with an internal address;
a drive pulse generator configured to generate a plurality of drive pulses in response to the comparison signal; and
a delay unit configured to output the external address as the internal address and delay the external address to thereby generate an internal address synchronized with the drive pulses in response to the activation of the plurality of drive pulses in case that the external address is different from the internal address, and to output the internal address without latching the external address in response to the inactivation of the plurality of drive pulses if the external address is identical to the internal address.

35. The internal address generator as recited in claim 34, wherein the address detector includes:
   a delay for delaying the internal address for a predetermined time; and
   an exclusive OR gate for logically combining the external address and an output of the delay to thereby output the comparison signal.

36. The internal address generator as recited in claim 35, wherein the drive pulse generator includes:
   a NAND gate for logically combining the comparison signal and an input pulse; and
   an inverter for inverting an output of the NAND gate to thereby generate the plurality of drive pulses.

37. An internal address generator for use in a semiconductor memory device, comprising:
   an address detector configured to detect a state variation of an address and generate an address state detection signal;
   a drive pulse generator configured to generate a plurality of drive pulses in response to the address state detection signal;
   an input latch unit configured to latch the external address and output the latched external address in response to the address state detection signal and a read/write flag; and
   an address generator configured to delay the external address synchronized with the plurality of drive pulses to output the delayed external address as an internal column address in response to the address state detection signal and the read/write flag,
   wherein the address generator is selectively disabled in response to the inactivation of the address state detection signal.

38. The internal address generator as recited in claim 37, wherein the address detector includes:
   a delay for delaying the internal address for a predetermined time; and
   an exclusive OR gate for logically combining the external address and an output of the delay to thereby output the comparison signal.

39. The internal address generator as recited in claim 38, wherein the drive pulse generator includes:
   a NAND gate for logically combining the comparison signal and an input pulse; and
   an inverter for inverting an output of the NAND gate to thereby generate the plurality of drive pulses.

* * * * *